(12) United States Patent
Springer

(10) Patent No.: US 8,476,097 B2
(45) Date of Patent: Jul. 2, 2013

(54) METHOD FOR MANUFACTURING AND SCRIBING A THIN-FILM SOLAR CELL

(75) Inventor: Jiri Springer, Dresden (DE)

(73) Assignee: Oerlikon Solar AG, Trubbach, Trubbach (CH)

( * ) Notice: Subject to any disclaimer, the term of this patent is extended or adjusted under 35 U.S.C. 154(b) by 635 days.

(21) Appl. No.: 12/675,190

(22) PCT Filed: Aug. 28, 2008

(86) PCT No.: PCT/EP2008/091316
§ 371 (c)(1),
(2), (4) Date: Feb. 25, 2010

(87) PCT Pub. No.: WO2009/027476
PCT Pub. Date: Mar. 5, 2009

(65) Prior Publication Data
US 2011/0186110 A1      Aug. 4, 2011

Related U.S. Application Data

(60) Provisional application No. 60/968,898, filed on Aug. 30, 2007.

(51) Int. Cl.
*H01L 11/00* (2006.01)
(52) U.S. Cl.
USPC ......... 438/68; 438/96; 438/113; 438/E31.124
(58) Field of Classification Search
USPC ......... 438/68, 80, 96–98, 113–114, 463–465; 136/244, 249, 251; 219/121.68, 121.75, 121.787
See application file for complete search history.

(56) References Cited

U.S. PATENT DOCUMENTS

| | | | |
|---|---|---|---|
| 4,292,092 A | 9/1981 | Hanak | |
| 5,296,674 A | 3/1994 | Praschek et al. | |
| 5,956,572 A * | 9/1999 | Kidoguchi et al. | 438/96 |
| 6,858,461 B2 * | 2/2005 | Oswald et al. | 438/68 |
| 2005/0272175 A1 | 12/2005 | Meier et al. | |

FOREIGN PATENT DOCUMENTS

WO   2005119782 A1   12/2005

OTHER PUBLICATIONS

International Search Report for PCT/EP2008/061316 dated May 7, 2009.
Written Opinion for PCT/EP2008/061316 dated May 7, 2009.
Compaan et al, "Optimization of Laser Scribing for Thin-Film Photovoltaics," May 13, 1996, pp. 769-772, XP010208263.

* cited by examiner

*Primary Examiner* — Dung A. Le
(74) *Attorney, Agent, or Firm* — Pearne & Gordon LLP

(57) ABSTRACT

A method for manufacturing a thin-film solar cell includes providing a first conducting layer on a substrate that has an area at least 0.75 m2. The first conducting layer is located in a deposition portion of the area. An ultraviolet laser beam is applied through a lens to the first conducting layer. Portions of the first conducting layer are scribed form a trench through the layer. The lens focuses the beam and has a focal length at least 100 mm. The focused beam includes an effective portion effective for the scribing and an ineffective portion ineffective for the scribing. The substrate sags and the first conducting layer remains in the effective portion of the focused beam across the area during the step of applying. One or more active layers are provided on the first conducting layer. A second conducting layer is provided on the one or more active layers.

12 Claims, 3 Drawing Sheets

METHOD FOR MANUFACTURING AND SCRIBING A THIN-FILM SOLAR CELL

CROSS-REFERENCE TO RELATED APPLICATIONS

This application is the National Stage of International Application No. PCT/EP2008/091316, filed Aug. 28, 2008, which claims the benefit of U.S. Provisional Patent Application Ser. No. 60/968,898, filed Aug. 30, 2007, the entire disclosures of which are incorporated herein by reference.

BACKGROUND OF THE INVENTION

1. Field of the Invention

The present invention relates to a solar cell and its method of manufacture, and more particularly to a system and method for manufacturing thin-film solar cells on a large area substrate using a laser scribing technique.

2. Description of Related Art

Thin-film solar cells having monolithic series interconnections can be formed by using scribing lasers or mechanical structuring. Mechanical structuring can include photolithographic or chemical etching structuring. The structuring is useful to form photovoltaic (PV) modules or "arrays". These concepts allow the PV modules to be adapted to the desired output characteristics—$V_{oc}$ (open circuit voltage), $I_{sc}$ (short-circuit-current) and FF (fill factor—defined as the maximum power produced at the maximum power point, divided by the product of $I_{sc}$ and $V_{oc}$, which is always less than 1). Thus, these features can be specifically tailored to the needs/applications of the user.

It is known to form solar cells on a substrate and to use a laser scribing technique in the manufacture of such solar cells. A method of manufacturing solar cells using scribing lasers is disclosed in U.S. Pat. No. 4,292,092, which is incorporated herein by reference. A method of manufacturing solar cells using scribing lasers is also disclosed in U.S. patent application publication number US 2005/0272175 A1, which is incorporated herein by reference.

BRIEF SUMMARY OF THE INVENTION

In accordance with one aspect of the present invention, provided is a method for manufacturing a thin-film solar cell. The method includes the step of providing a first conducting layer on a substrate, wherein the substrate has an area at least 0.75 m² and the first conducting layer is located in a deposition portion of the area. An ultraviolet laser beam is applied through a lens to the first conducting layer. Portions of the first conducting layer are scribed through to the substrate to form a trench through the first conducting layer. The lens focuses the ultraviolet laser beam and has a focal length that is greater than 100 mm. The focused ultraviolet laser beam includes an effective portion that is effective for the scribing and an ineffective portion that is ineffective for the scribing. The substrate sags such that the portions of the first conducting layer that are scribed during the step of applying are located within the effective portion of the focused ultraviolet laser beam when scribed. One or more active layers are provided on the first conducting layer. A second conducting layer is provided on the one or more active layers.

In accordance with another aspect of the present invention, provided is a thin-film solar cell system including a substrate having an area at least 0.75 m². A first conducting layer is located on the substrate in a deposition portion of said area. The first conducting layer includes ZnO. The first conducting layer has a plurality of first trenches scribed through to the substrate to define a plurality of separate first conducting layer portions. The plurality of separate first conducting layer portions are separated from each other by the plurality of first trenches. The system includes an ultraviolet laser, which includes a lens having a focal length that is greater than 100 mm that focuses a laser beam of the ultraviolet laser onto the first conducting layer to scribe the plurality of first trenches. The laser beam includes an effective portion that is effective for scribing the plurality of first trenches and an ineffective portion that is ineffective for scribing the plurality of first trenches. The substrate sags and some part of the first conducting layer remains in the effective portion of the laser beam while the plurality of first trenches is scribed. One or more active layers cover some portion of the first conducting layer. The one or more active layers have a plurality of second trenches scribed through to the first conducting layer to define a plurality of separate active layer portions. The plurality of separate active layer portions are separated from each other by the plurality of second trenches. Each separate active layer portion of the plurality of separate active layer portions covers a portion of a corresponding one of the plurality of separate first conducting layer portions. A second conducting layer covers some portion of the one or more active layers. The second conducting layer has a plurality of third trenches scribed through to an underlying layer to define a plurality of separate second conducting layer portions. The plurality of separate second conducting layer portions are separated from each other by the plurality of third trenches. Each separate second conducting layer portion of the plurality of second conducting layer portions covers a portion of a corresponding separate active layer portion. The solar cell system includes a plurality of adjacent solar cells that are electrically connected in series on the substrate by connecting the first conducting layer and the second conducting layer.

In accordance with another aspect of the invention, provided is a laser scribing apparatus for forming a thin-film solar cell. The apparatus includes a support device adapted to support a solar cell substrate that has an area of at least 0.75 m² and a conducting layer including ZnO located on the substrate in a deposition portion of said area. A selectively positionable ultraviolet laser generates a beam having a wavelength of less than 400 nm. The laser includes a lens having a focal length of at least 100 mm for focusing the beam. The selectively positionable ultraviolet laser is selectively positionable with respect to the substrate. The lens focuses the beam onto the conducting layer such that the beam scribes portions of the conducting layer through to the substrate to form a trench through the conducting layer. The beam includes an effective portion that is effective for scribing the portions of the conducting layer and an ineffective portion that is ineffective for scribing the portions of the conducting layer. The substrate sags when supported by the support device such that the portions of the conducting layer that are scribed by the beam are located within the effective portion of the beam when scribed.

DETAILED DESCRIPTION OF THE INVENTION

Figure 1:
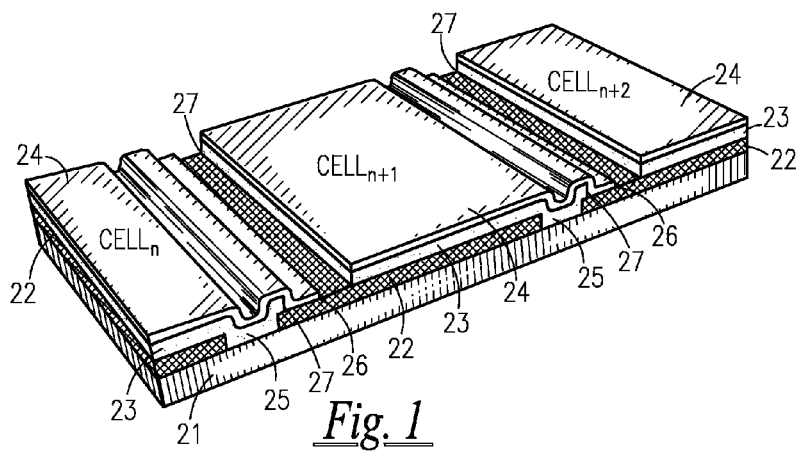
FIG. 1 is a schematic drawing of several thin-film series connected solar cells.

FIG. 1 is a schematic drawing showing a portion of a thin-film, series connected photovoltaic (PV) module. This figure shows three cells ($Cell_n$, $Cell_{n+1}$, and $Cell_{n+2}$) connected in series, although any number of desired cells could be manufactured, and the individual cells could instead be connected in parallel, or not electrically connected together, as desired.

Generally, as shown in FIG. 1, a typically non-conducting substrate 21, which could be of glass, for example, has a first conducting layer 22 provided on the substrate. Then, one or more active layers 23 are provided on the first conducting layer, and an outer electrode layer or second conducting layer 24 is provided on the active layers as a second conducting layer. The various layers are separated into separate portions, each for use in a separate solar cell, by one or more techniques, such as laser scribing the individual layers using a laser beam before the subsequent layer is applied. For example, portions of the first conducting layer 22 can be scribed through to the substrate 21 by the laser beam to form a plurality of separate first conducting layer portions that are separated from each other by a plurality of first trenches 25. Portions of the one or more active layers 23 can be scribed through to the first conducting layer 22 to form a plurality of separate active layer portions that are separated from each other by a plurality of second trenches 27. Portions of the second conducting layer 24 can be scribed through to an underlying layer to form a plurality of second conducting layer portions that are separated from each other by a plurality of third trenches 26. This results in the trenches 25, 26, and 27 that separate the conducting layer, active layer(s) and second conducting layer, respectively, into the separate solar cells.

The substrate 21 and first conducting layer 22 are typically transparent to allow light to reach the active layer(s) 23 through them, because the semiconducting active layers are transparent enough to let light pass. Furthermore, a back reflector can be applied so that the light is forced to pass a second time through the active layers 23 to be eventually absorbed to enhance efficiency. Alternatively, the second conducting layer 24 could be made transparent to allow light to reach the active layer from that side.

Furthermore, the second conducting layer 24 of one cell is typically electrically connected to the first conducting layer 22 of an adjacent cell by overlapping the second conducting layer on the first conducting layer, in order to series connect the individual solar cells, resulting in a series connected PV module. For example, the second conducting layer portion of $Cell_n$ overlaps the first conducting layer portion of adjacent $Cell_{n+1}$, and the second conducting layer portion of $Cell_{n+1}$ overlaps the first conducting layer portion of adjacent $Cell_{n+2}$.

A transparent conductive oxide (TCO) layer that includes zinc oxide (ZnO) can be chosen for the first conducting layer 22. The first conducting layer 22 can be deposited on an upper surface of the substrate 21 in a deposition portion of the upper surface, such as by using a low pressure chemical vapor deposition (LP-CVD) process or a plasma enhanced chemical vapor deposition (PECVD) process. Alternatively, a sputtering process might be used to deposit the TCO layer on the transparent substrate in the deposition portion. The deposition portion in which the first conducting layer 22 is located can be the entire upper surface of the substrate or some part of the upper surface. Example transparent substrates include glass and highly transparent UV-stable plastic. After deposition on the substrate, portions of the ZnO TCO layer can be laser scribed using an ultraviolet laser beam through to the substrate 21, forming the trench 25 and differentiating the first conducting layer 22 into the plurality of separate first conducting layer portions, each of which corresponds to an individual solar cell.

One or more active layers can be used to form a p-i-n-junction, typically including differently doped and/or undoped silicon layers. These active layers can be deposited on the ZnO TCO layer, such as by an LP-CVD process or a PECVD process. This may result in the TCO trench 25 being filled with one or more of the active layers, as shown in FIG. 1. After their application, portions of the active layer(s) 23 can be laser scribed down to expose the first conducting layer 22, forming the trench 27 and differentiating the active layer(s) into the plurality of separate active layer portions, each of which corresponds to an individual solar cell.

An electrode layer as the second conducting layer 24 is then applied over the active layer(s) to form the individual outer electrodes of the individual solar cells. The second conducting layer 24 can be comprised of the TCO or a fully reflective material, such as aluminum or other suitable material. The second conducting layer 24 can be applied over the active layer(s) using a LP-CVD process or a PECVD process, although alternative processes, such as sputtering, could also be used. After application, portions of the second conducting layer 24 can be laser scribed down to expose an underlying layer, forming the trench 26 and differentiating the second conducting layer into the plurality of second conducting layer portions, each of which corresponds to an individual solar cell.

The proper arrangement of the three scribe trenches 25, 26, and 27, as shown in FIG. 1, results in the series-connected cells of the PV module. Although only three individual cells are shown for convenience, the process is similar for any desired number of series connected cells.

Figure 2:
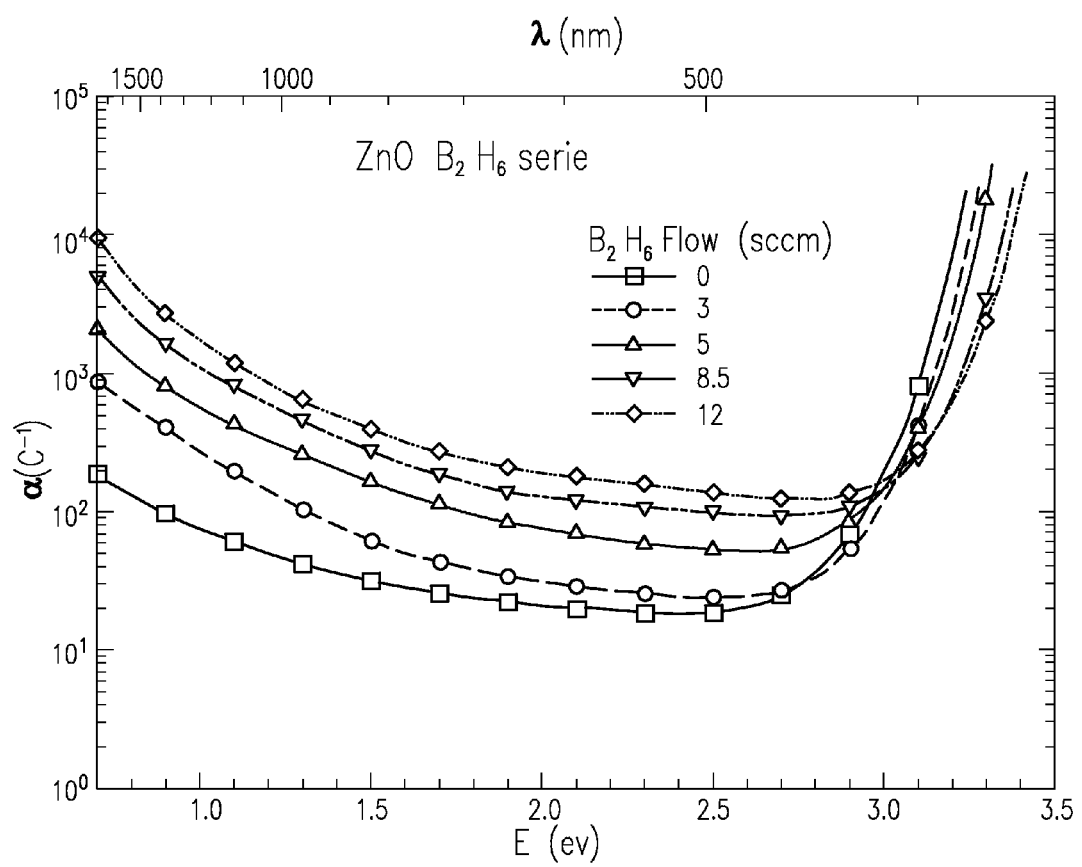
FIG. 2 is a plot showing experimentally measured absorption of LP-CVD by a ZnO TCO layer using a scribing technique.

Because the ZnO TCO first conducting layer 22 has a strong absorption below the 400 nm wavelength, an ultraviolet Nd:$YVO_4$ laser (for example, a Coherent AVIA 355-X 10 Watt laser) operating at a wavelength of 355 nm (~3.5 eV) can be applied for the TCO scribing step (see the characteristics of the laser given below). By using such a short wavelength ultraviolet laser beam on the ZnO TCO first conducting layer 22, much or most of the laser beam is efficiently absorbed by the ZnO film. This is shown by the experimentally derived plot of FIG. 2, showing the absorption of a LP-CVD formed ZnO layer. The horizontal axis upper scale represents the laser wavelength, and the lower scale represents the equivalent energy of the laser impinging on the TCO layer. Alpha represents a relative absorption coefficient of the laser energy. $B_2H_6$ (Diborane) is a boron-hydrogen doping gas mixed during TCO (ZnO) application for p-doping in semiconductor processes. The "sccm" (standard cubic centimeters per minute) represents a gas flow measure of the gas. One can see from the figure that the relative absorption of light energy increases essentially on or after 2.9 eV and above. Therefore a 3.2 eV laser is about 100 times more efficient than a 2.5 or 2.0 eV laser.

Using such an ultraviolet laser to form a PV series connected module results in an efficient melting and evaporation, and/or chipping off, of the ZnO TCO first conducting layer 22 in the trench 25 cut down to the substrate 21 (see FIG. 1). Such an ultraviolet laser beam does not just melt the ZnO material, but vaporizes much or all of the ZnO material in contact with the laser beam, resulting in a clean cut and substantially smooth trench 25 (reducing or eliminating the undesirable beads and bulges in the trench). Therefore, using a high-energy (short wave) ultraviolet laser beam at the appropriate wavelength (to optimize the desired absorption of the laser energy) achieves a high effectivity, and results in a higher fill factor FF with proper isolation of the individual cells. Similarly, for materials other than ZnO, choosing the appropriate laser wavelength for high absorption could also provide similar results. Accordingly, a very good isolation at a high scribe velocity (greater than 10 m/min) may be achieved by using such a short wavelength laser beam for scribing the TCO layer.

Figure 3:
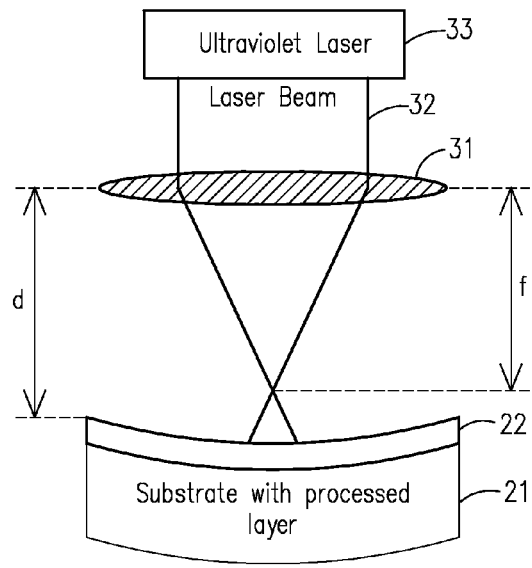
FIG. 3 is a schematic drawing of a laser scribing technique using a laser beam and a focusing lens.

FIG. 3 is a schematic drawing of a laser scribing system for forming a PV module. A lens 31 focuses the laser beam 32 from an ultraviolet laser 33 onto the first conducting layer 22 on the substrate 21, to scribe trenches through the first conducting layer to the substrate, as discussed above. The lens 31 has an associated focal length (f) and is located above the first conducting layer 22 by a distance (d).

The surface of the substrate 21 having the deposition portion (in which the first conducting layer 22 is deposited such as by a PEVCD process) can have a large area of at least 0.75 m$^2$. Such "large area substrates" tend to exhibit significant sagging across the large area during the scribing process due to their large size and corresponding weight. The substrate 21 can be supported at various points along the substrate, and sagging occurs between such support points. The amount of sag depends on factors such as the substrate material and its thickness and the distance between support points. Sag can be kept as low as possible, such as below 1 mm. However, sagging of 1 mm or more is also possible. Substrate 21 sag is shown schematically in FIG. 3.

Figure 4A:
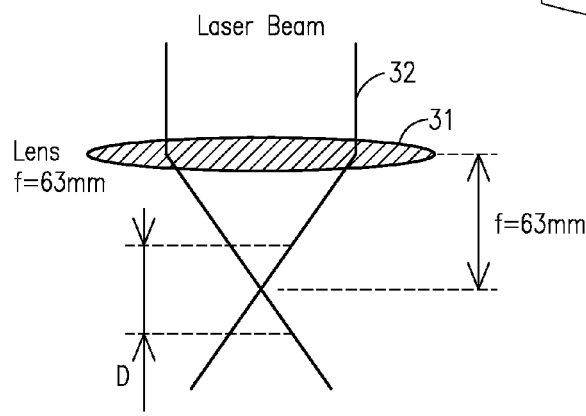
FIG. 4a is a schematic drawing of a laser beam and focusing lens.
Figure 4B:
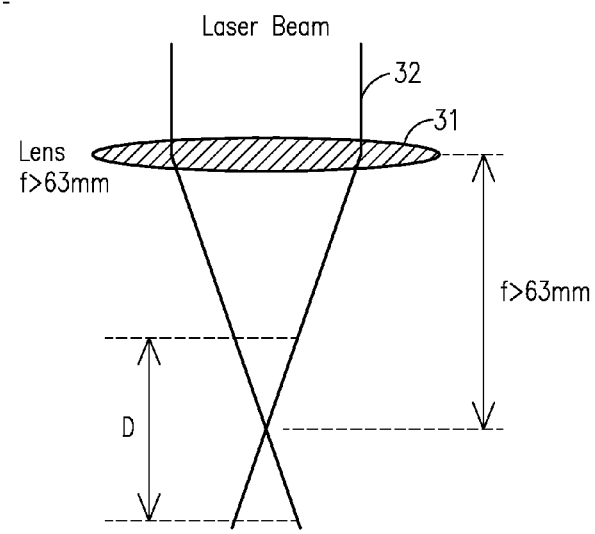
FIG. 4b is a schematic drawing of a laser beam and focusing lens.

The focused laser beam has a process window (D), as shown in FIGS. 4a and 4b. The process window (D) provides an effective portion of the focused laser beam that is effective for scribing a trench in the first conducting layer. The process window (D) provides a distance range in which the power density of the focused laser beam is larger than a given effective value. The effective value can be a power density value that is effective for evaporating and/or chipping off portions of the first conducting layer. Portions of the focused laser beam that lie outside of the process window (D) have a lower power density and are ineffective for scribing the trench in the first conducting layer.

The length the process window (D) depends on the width of the laser beam 32 and the focal length (f) of the lens 31. For a given laser beam width, the process window (D) can be lengthened by choosing a lens 31 having a longer focal length (f). This is shown schematically in FIGS. 4a and 4b. The lens 31 in FIG. 4a has a focal length (f) of 63 mm, while the lens in FIG. 4b has a focal length (f) greater than 63 mm. The width of the laser beam 32 is substantially the same in FIGS. 4a and 4b. However, the process window (D) in FIG. 4b is longer than the process window in FIG. 4a, due to the longer focal (f) length of the lens 31 in FIG. 4b.

Prior art scribing lasers are known to use a lens 31 having a focal length of 63 mm. The process window (D) established by such a lens may be suitable for small substrates, but may be unsuitable for large area substrates of at least 0.75 m$^2$, such as those used in PEVCD deposition systems. Small substrates exhibit less sag than large area substrates, and, primarily due to mechanical reasons, the distance (d) between the lens 31 and the processed (i.e., scribed) layer is easily controlled. A movable lens 31 and laser 33 can be located above a substrate 21 and scribed layer, with the lens 31 at the distance (d) above the scribed layer. The moveable lens 31 and laser 33 would follow a predetermined (e.g., pre-programmed) scribing route to scribe trenches in the scribed layer. As the substrate 21 becomes large, such as greater than or equal to 0.75 m$^2$, it could sag out of the process window (D) that is established by a 63 mm laser, which could place the first conducting layer 22 outside of the process window (D).

With increasing substrate size, a guiding system (e.g., a y device or an x-y device) of the laser 33 and lens 31 becomes more and more sensitive to substrate sagging. Compensating for substrate sag may increase moving masses and construction costs of the scribing system. When the substrate assumes an industrial large area (e.g., $\geq 0.75$ m$^2$), the variables perturbating this distance become more and more relevant, especially leading to difficulties when repeatable scribing is required. However, a lens having a larger focal length provides a larger depth of field and a larger process window (D), which results in a better tolerance of substrate sag.

In an embodiment, the substrate 21 is a large area substrate of at least 0.75 m$^2$, the laser beam 32 is an ultraviolet laser beam having a wavelength of less than 400 nm (e.g., about 355 nm), and the laser beam 32 has a diameter of 6 mm or less, such as 3.5 mm, for example. The first conducting layer 22 is deposited on the large area substrate in a deposition portion by a PEVCD process and includes ZnO. The lens 31 for focusing the laser beam 32 has a focal length of at least 100 mm (e.g., between 100 mm and 150 mm). Such a system has been determined to be effective for scribing trenches in the first conducting layer 22 as discussed above, despite significant substrate sag due to the substrate's large area. The large area substrate sags during the scribing process. However, the larger process window (D) accommodates such sag so that the portions of the substrate 21 and the first conducting layer 22 onto which the laser beam 32 is directed remain in the effective portion of the focused laser beam. Therefore, a position of the lens 31 and laser 33 in the z direction (e.g., the vertical direction) can remain substantially constant during the scribing process, while the lens and laser and/or the substrate are moved along the predetermined scribing route in one or both of the x and y directions.

A larger focal length increases the beam diameter in focus and therefore increases a spot size of the focused laser beam. Normally this is not an advantage because it is desirable to reduce the spot size in order to increase the energy density locally. Reducing the spot size and increasing the energy density locally can allow for the use of a less energy-consuming laser. Surprisingly, it has been found that the robustness (steadiness) of the scribing process is enhanced by increasing the spot size of the focused laser beam by using a lens with a larger focal length. For example, the scribing process is less sensitive to particles. The isolation between separate layer portions (e.g., the separate first conducting layer portions) was also found to be improved, due a larger scribe width (typically 20-35 μm compared to 10-20 μm for a smaller 63 mm lens). Improved isolation can be beneficial in large PV modules, where the difference in electrical potential may be greater than 200V.

Figure 5:
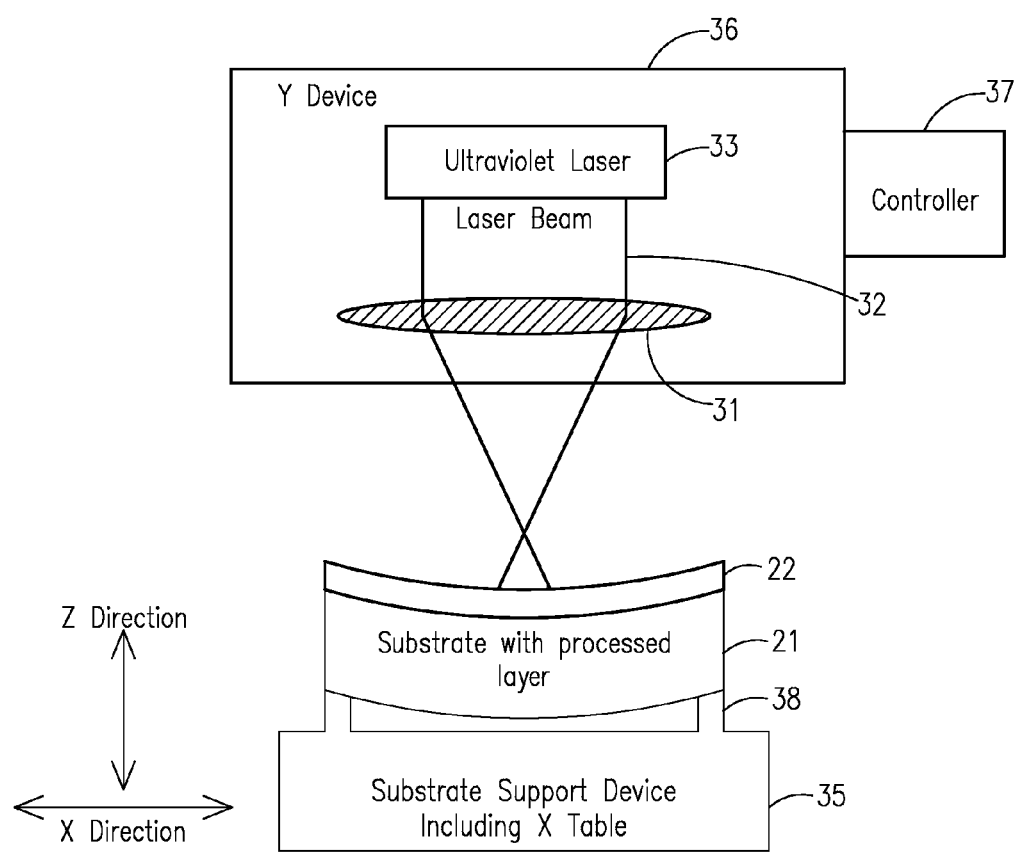
FIG. 5 is a schematic drawing of a laser scribing apparatus.

An example laser scribing apparatus is shown schematically in FIG. 5. The laser scribing apparatus includes a selectively positionable ultraviolet laser 33 and lens 31 for scribing portions of the first conducting layer 22 and/or the one or more active and second electrode layers as discussed above. The apparatus further includes a substrate support device 35 for supporting the substrate 21, which has an area of at least 0.75 m$^2$. The substrate support device 35 can include an x table for moving the substrate in an x-direction. The substrate 21 can be positioned on pins 38 or belts/rollers (not shown). The laser 33 and lens 31 are selectively positionable with respect to the substrate 21 and support device 35. For example, the laser 33 and lens 31 can be moved in the y-direction by a y device 36. The combined movement of the substrate 21 in the x-direction by the x table and the laser 33 and lens 31 in the y-direction by the y device 36 allows for scribing along the predetermined scribing route. The lens 31 focuses the laser beam 32 onto the first conducting layer 22 to scribe the desired trenches in the first conducting layer as the substrate 21 and the laser 33 and lens 31 are moved along the scribing route.

It is to be appreciated that, alternatively, the laser 33 and lens 31 can be moved in both of the x- and y-directions while the substrate 21 remains stationary during scribing. Also, the substrate 21 can be moved in both of the x- and y-directions while the laser 33 and lens 31 remain stationary during scribing.

Example x- and z-directions are shown schematically in FIG. 5 and the y-direction would be perpendicular to both of the x- and z-directions. The x- and y-directions can be horizontal directions.

The laser scribing apparatus can include a controller 37 for controlling the movements of y device 36 and, therefore, the movements of the laser 33 and lens 31. The controller 37 can also control the operations of the x table and the movements of the substrate 21 and processed layer 22. The controller 37 can be an electronic controller and may include a processor. The controller 37 can include one or more of a microprocessor, a microcontroller, a digital signal processor (DSP), an application specific integrated circuit (ASIC), a field-programmable gate array (FPGA), discrete logic circuitry, or the like. The controller 37 can further include memory and may store program instructions that cause the controller to provide the functionality ascribed to it herein. The memory may include one or more volatile, non-volatile, magnetic, optical, or electrical media, such as read-only memory (ROM), random access memory (RAM), electrically-erasable programmable ROM (EEPROM), flash memory, or the like.

In an embodiment, the controller 37 is programmable and executes a scribing program. The scribing program can include the predetermined scribing route and the controller 37 can control the movements of the x table and y device 36 based on the predetermined scribing route. The controller 37 can receive various analog and/or digital inputs from the x table and the y device 36, such as position and speed inputs, and output various analog and/or digital control signals to the x table and the y device. The controller 37 can also communicate with and control operations of the ultraviolet laser 33.

The substrate 21 sags when supported by the support device 35. As discussed above, the larger process window (D) provided by the laser 33 and lens 31 accommodates such sag so that the portions of the substrate 21 and the first conducting layer 22 onto which the laser beam is directed remain in the effective portion of the focused laser beam. Therefore, a position of the lens 31 and laser 33 in the z direction can remain substantially constant during the scribing process, while the lens and laser are moved along the predetermined scribing route in the y direction and the substrate is moved in the x direction. For example, the lens 31 and laser 33 can remain at a substantially constant vertical distance above the support device 35 during the scribing process.

Acceptable laser parameters for scribing a TCO trench on a film-covered side of a large area glass substrate coated with ZnO as the TCO layer include a laser power of 8 Watts or more and a scribe velocity of 25 m/min or more. A focusing lens with a focal length between 100 mm and 150 mm can be utilized for focusing the TCO scribing laser.

Example Application:

Specifications of an example applied UV-laser (Coherent AVIA 355-X) are:

| | |
|---|---|
| Wavelength: | 355 nm |
| Power: | 10.0 Watt at 60 kHz |
| Pulse frequency range: | 1 Hz to 100 kHz |
| Pulse length: | <30 ns up to 60 kHz |
| M2: | <1.3 (TEM00) (wave mode) |
| Polarization: | >100:1, horizontal |
| Beam diameter (exit): | 3.5 mm at 1/e2 |
| Beam divergence at full angle: | <0.3 mrad |

Known methods for scribing the active and/or second electrode layers 23, 24 (FIG. 1) can be utilized, such as the methods disclosed in U.S. Pat. No. 4,292,092, incorporated herein by reference. These layers can be scribed, for example, using a 532 nm laser.

Laser scribing or layer structuring processes for coated substrates with ZnO deposited by other methods (sputtering, etc.) or other TCO materials with similar absorption characteristics to ZnO could also benefit from the above-disclosed process as well.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for manufacturing a thin-film solar cell, comprising the steps of
   providing a first conducting layer on a substrate, wherein the substrate has an area at least 0.75 m$^2$ and the first conducting layer is located in a deposition portion of the area;
   applying an ultraviolet laser beam through a lens to the first conducting layer and scribing portions of the first conducting layer through to the substrate to form a trench through the first conducting layer,
      wherein the lens focuses the ultraviolet laser beam and has a focal length that is greater than 100 mm,
      wherein the focused ultraviolet laser beam includes an effective portion that is effective for the scribing and an ineffective portion that is ineffective for the scribing, and
      wherein the substrate sags such that the portions of the first conducting layer that are scribed during the step of applying are located within the effective portion of the focused ultraviolet laser beam when scribed;
   providing one or more active layers on the first conducting layer; and
   providing a second conducting layer on the one or more active layers.

2. The method of claim 1, wherein the ultraviolet laser beam has a wavelength of less than 400 nm.

3. The method of claim 2, wherein the ultraviolet laser beam has a wavelength of about 355 nm.

4. The method of claim 3, wherein the focal length is less than 150 mm.

5. The method of claim 4, wherein a position of the lens in a vertical direction remains substantially constant during the step of applying.

6. The method of claim 4, wherein the trench has a width of at least 20 μm.

7. The method of claim 4, wherein the first conducting layer includes ZnO.

8. The method claim 7, wherein the portions of the first conducting layer that are scribed are evaporated by the ultraviolet laser beam such that the trench includes substantially smooth trench walls.

9. The method of claim 8, further comprising the steps of:
scribing portions of the one or more active layers through to the first conducting layer; and
scribing portions of the second conducting layer through to an underlying layer.

10. The method of claim 9, wherein a plurality of thin-film solar cells that are electrically connected in series are formed on the substrate.

11. The method of claim 1, wherein the effective portion of the focused ultraviolet laser beam is arranged at a maximum extent of substrate sag to locate the portions of the first conductive layer that are scribed during the applying of the ultraviolet laser beam within the effective portion.

12. The method of claim 1, wherein the effective portion of the focused ultraviolet laser beam is arranged to locate all portions of the first conductive layer that are scribed during the applying of the ultraviolet laser beam within the effective portion.

\* \* \* \* \*